US 11,678,462 B2

(12) United States Patent
Sweeney et al.

(10) Patent No.: US 11,678,462 B2
(45) Date of Patent: Jun. 13, 2023

(54) ELECTRICAL POWER DISTRIBUTION OPTIMIZED LIQUID IMMERSION COOLING TANK WITH VARIABLE FLOW FOR HIGH DENSITY COMPUTER SERVER EQUIPMENT

(71) Applicant: Tyco Fire & Security GmbH, Neuhausen am Rheinfall (CH)

(72) Inventors: Michael J Sweeney, Seattle, WA (US); Lewis Harris Bridges, III, Chandler, AZ (US)

(73) Assignee: Tyco Fire & Security GMBH

( * ) Notice: Subject to any disclaimer, the term of this patent is extended or adjusted under 35 U.S.C. 154(b) by 0 days.

(21) Appl. No.: 17/738,800

(22) Filed: May 6, 2022

(65) Prior Publication Data
US 2022/0361365 A1 Nov. 10, 2022

Related U.S. Application Data

(60) Provisional application No. 63/185,336, filed on May 6, 2021.

(51) Int. Cl.
*H05K 7/20* (2006.01)
*H02B 1/20* (2006.01)
*H02M 7/00* (2006.01)

(52) U.S. Cl.
CPC ........... *H05K 7/20236* (2013.01); *H02B 1/20* (2013.01); *H02M 7/003* (2013.01)

(58) Field of Classification Search
None
See application file for complete search history.

(56) References Cited

U.S. PATENT DOCUMENTS

| | | | |
|---|---|---|---|
| 10,028,409 B1* | 7/2018 | Metzler | H05K 7/203 |
| 10,123,463 B2 | 11/2018 | Best et al. | |
| 10,156,873 B2* | 12/2018 | Shelnutt | H05K 7/20809 |
| 10,257,960 B1 | 4/2019 | Banerjee et al. | |
| 10,481,650 B2* | 11/2019 | Saito | H05K 7/20781 |
| 2014/0218861 A1* | 8/2014 | Shelnutt | H05K 7/20818 |
| | | | 361/679.53 |

(Continued)

FOREIGN PATENT DOCUMENTS

WO 2017091862 6/2017

OTHER PUBLICATIONS

U.S. Appl. No. 17/491,041, filed Sep. 30, 2021, Michael J Sweeney.

(Continued)

*Primary Examiner* — Courtney L Smith
(74) *Attorney, Agent, or Firm* — Fletcher Yoder, PC

(57) ABSTRACT

A liquid immersion cooling system includes a tank defining a tank interior configured to receive electronic components (e.g., servers) and a thermally conductive dielectric liquid to cool the electronic components. The liquid immersion cooling system also includes a power shelf external to the tank interior, where the power shelf includes a converter configured to receive an alternating current (AC) power supply and convert the AC power supply to a direct current (DC) power supply. The liquid immersion cooling system also includes a DC bus configured to route the DC power supply from the power shelf, into the tank interior, and to the electronic components.

25 Claims, 6 Drawing Sheets

(56) References Cited

U.S. PATENT DOCUMENTS

| | | | |
|---|---|---|---|
| 2017/0126143 A1* | 5/2017 | White | H05K 7/1498 |
| 2017/0127558 A1* | 5/2017 | Best | H05K 7/2079 |
| 2020/0383237 A1 | 12/2020 | Hashimoto | |
| 2021/0378148 A1* | 12/2021 | Chen | H05K 7/20272 |
| 2022/0151114 A1* | 5/2022 | Heydari | H05K 7/208 |

OTHER PUBLICATIONS

International Search Report and Written Opinion for PCT Application No. PCT/US2022/028157, dated Sep. 1, 2022, 13 pages.

* cited by examiner

FIG. 2

ELECTRICAL POWER DISTRIBUTION OPTIMIZED LIQUID IMMERSION COOLING TANK WITH VARIABLE FLOW FOR HIGH DENSITY COMPUTER SERVER EQUIPMENT

CROSS-REFERENCE TO RELATED APPLICATIONS

This application claims priority from and the benefit of U.S. Provisional Application Ser. No. 63/185,336, entitled "ELECTRICAL POWER DISTRIBUTION OPTIMIZED LIQUID IMMERSION COOLING TANK WITH VARIABLE FLOW FOR HIGH DENSITY COMPUTER SERVER EQUIPMENT," filed May 6, 2021, which is hereby incorporated by reference in its entirety for all purposes.

This application also relates to U.S. application Ser. No. 17/491,041, entitled LIQUID IMMERSION COOLING TANK WITH VARIABLE FLOW FOR HIGH DENSITY COMPUTER SERVER EQUIPMENT," filed Sep. 30, 2021, which is hereby incorporated by reference in its entirety for all purposes.

BACKGROUND OF THE DISCLOSURE

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

Increasingly, data centers are relied upon for information storage. While providing efficient management of data, data centers have inherent limitations. Data centers necessarily comprise high numbers of computer servers, said computer servers being delicate instruments which require certain atmospheric conditions to operate efficiently. A side effect of server density is the generation of heat and the accompanying need to dissipate such heat.

The deployment of equipment such as computers and other electrical devices requires appropriate infrastructure to support it. In particular, such equipment requires precise control and regulation of environmental conditions. Cooling requirements for such equipment are important with the need to dissipate heat generated by such equipment being a significant limitation in data center design. Systems for controlling heat dissipation and/or cooling such equipment are necessarily important to maintain consistent environmental conditions.

While data centers are often air cooled, an alternate system involves an immersion system. Such immersion systems may be described as involving an immersion tank comprising a liquid coolant and electronic equipment immersed in such liquid coolant.

Conventional tank systems are characterized by tanks which are not insulated. Moreover, conventional tank systems have only one interior volume. The tank comprises a coolant inlet for receiving dielectric liquid coolant within an open interior volume and a coolant outlet for allowing the dielectric liquid coolant to flow from the open interior volume.

Servers are typically mounted in an immersion tank such that they form volumes between each respective vertically oriented rack-mountable server and the immersion tank wall to permit the flow of dielectric liquid coolant through the plurality of vertically oriented rack mountable servers. Traditional systems also may include alternating current (AC) power cords routed to individual servers immersed in liquid cooling fluid, typically one or two power cords for each server. For a tank containing 48 servers this would equate to 48 or 96 AC power cords connecting to the servers within the tank liquid. The abundance of cords is difficult and cumbersome to handle and organize, and reduces a volume of the tank devoted to the servers themselves. Further, failures in AC to direct current (DC) conversion occurring at the server can be problematic because they require that the server be removed from the tank for servicing. Accordingly, it is now recognized that improved liquid immersion systems and corresponding power distribution assemblies are desired.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

A liquid immersion cooling system includes a tank defining a tank interior configured to receive electronic components (e.g., servers) and a thermally conductive dielectric liquid to cool the electronic components. The liquid immersion cooling system also includes a power shelf external to the tank interior, where the power shelf includes a converter configured to receive an alternating current (AC) power supply and convert the AC power supply to a direct current (DC) power supply. The liquid immersion cooling system also includes a DC bus configured to route the DC power supply from the power shelf, into the tank interior, and to the electronic components.

A liquid immersion cooling system includes a tank defining a tank interior configured to receive a thermally conductive dielectric liquid, electronic components disposed in the tank interior, and a power shelf external to the tank interior. The power shelf includes a converter configured to receive an alternating current (AC) power supply and convert the AC power supply to a direct current (DC) power supply. The liquid immersion cooling system also includes a DC bus coupled to the converter and extending into the tank interior, and connectors coupling the DC bus and the electronic components.

A method of operating a liquid immersion cooling system includes cooling, via a thermally conductive dielectric liquid, electronic components disposed in a tank interior of a tank. The method also includes receiving, at a power shelf disposed external to the tank interior, an alternating current (AC) power supply. The method also includes converting, via a converter of the power shelf, the AC power supply to a direct current (DC) power supply. The method also includes routing, via a DC bus coupled to the converter and extending into the tank interior, the DC power supply toward the electronic components.

BRIEF DESCRIPTION OF THE DRAWINGS

Various aspects of this disclosure may be better understood upon reading the following detailed description and upon reference to the drawings in which:

FIG. 2 is a sectioned plan view illustrating a portion of the liquid immersion cooling system of FIG. 1, including a number of power shelves, each power shelf being configured to receive dual AC input power supply, in accordance with an aspect of the present disclosure;

DETAILED DESCRIPTION

Figure 1:
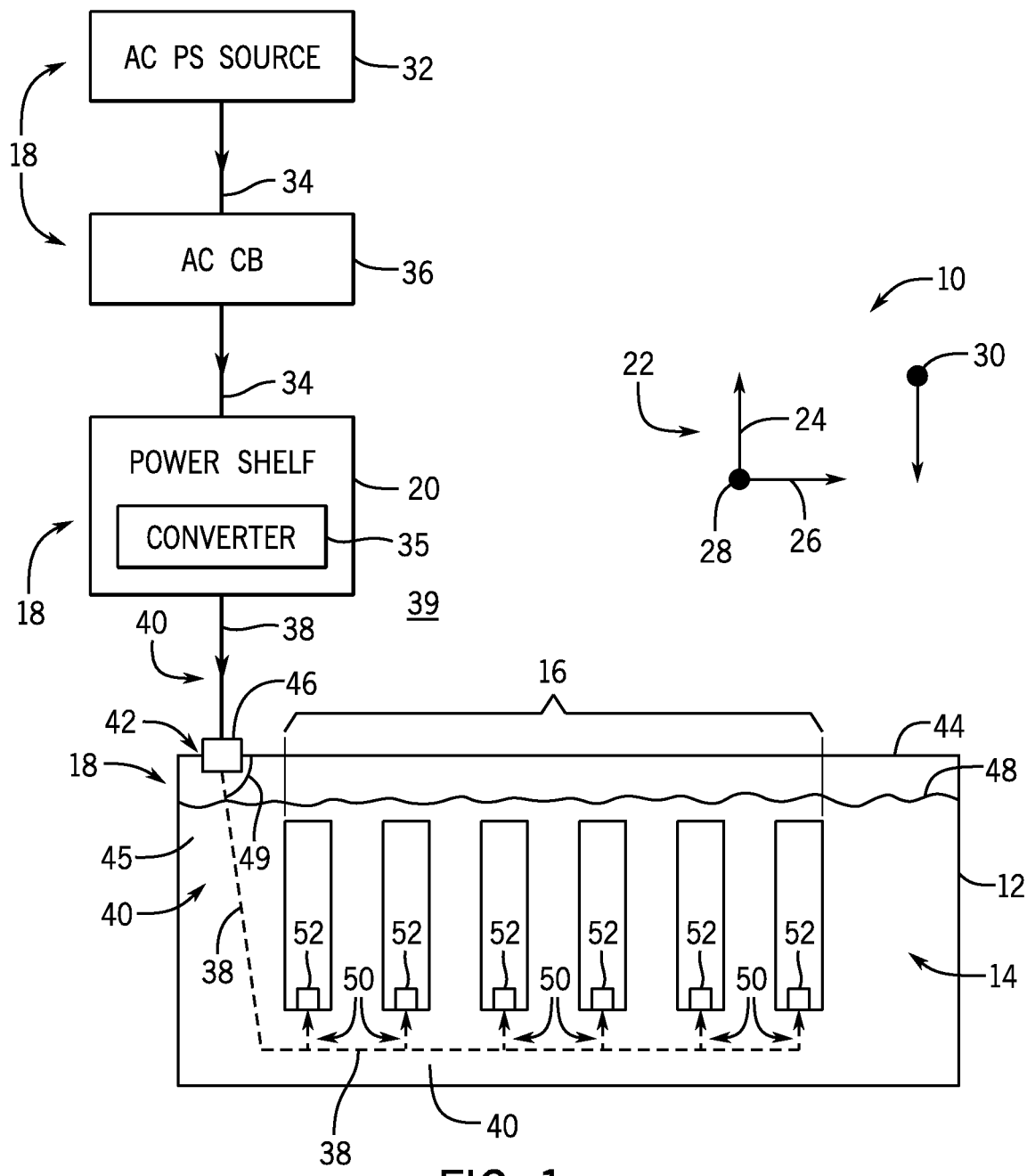
FIG. 1 is a schematic block diagram of a liquid immersion cooling system having a tank defining a tank interior configured to receive electronic components (e.g., servers), and having a power distribution assembly with one or more power shelves disposed outside of the tank interior, in accordance with an aspect of the present disclosure.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure relates generally to a liquid immersion cooling system having a tank defining a tank interior configured to receive electronic components (e.g., servers) and a thermally conductive dielectric liquid to cool the electronic components, and having a power distribution assembly. More particularly, the present disclosure relates to one or more power shelves corresponding to the power distribution assembly and disposed external to the tank interior, each of which having one or more converters configured to receive an alternating current (AC) power supply, convert the AC power supply to direct current (DC) power supply, and output the DC power supply through a DC bus into the tank interior and toward the electronic components disposed in the tank interior.

For example, the power distribution assembly may include the AC power supply, the power shelf and corresponding converter, an AC circuit breaker between the AC power supply and the power shelf, and the DC bus extending from the power shelf (e.g., the converter of the power shelf), through an opening in a lid coupled to the tank of the liquid immersion cooling system, through the tank interior, and underneath the electronic components disposed in the tank interior. The DC bus may include a first rigid portion coupled to the power shelf (e.g., the converter of the power shelf), a flexible portion coupled to the first rigid portion, a fuse disposed in the flexible portion, and a second rigid portion coupled to the flexible portion. The flexible portion may extend through the opening in the lid, and a gasket may be employed to seal (e.g., fully or partially seal) the opening about the flexible portion of the DC bus. The second rigid portion may extend underneath the electronic components disposed in the tank interior, and blind mate connectors may be employed to couple the second rigid portion with DC inputs (e.g., jacks) of the electronic components.

In some embodiments, multiple power shelves may be employed to provide redundancy in case a first power shelf fails (or a component associated with the first power shelf, such as the DC bus associated with the first power shelf). Additionally or alternatively, multiple power shelves may be employed to provide enhanced power capacity (e.g., to meet power demands associated with the electronic components). Additionally or alternatively, multiple power shelves may be employed to provide multiple DC power supplies at various voltages for compatibility with electronic components (e.g., servers) having different VDC requirements. Of course, each server may include additional components, such as one or more transformers, configured to receive the DC power supply at a particular VDC, such as 12 VDC, and generate various step-down voltages utilized to power various components of the corresponding server.

As previously described, the flexible portion of the DC bus may be directed through an opening in the lid coupled to the tank and into the tank interior, and a gasket may be employed to seal (e.g., fully or partially seal) the opening about the flexible portion of the DC bus. The fuse in the flexible portion of the DC bus may be disposed external to the tank interior (e.g., above the lid). The gasket may be employed in an effort to block the thermally conductive dielectric liquid from escaping through the opening. For example, while a liquid level of the thermally conductive dielectric liquid may be below an underside of the lid (e.g., such that a gap exists between the liquid level and the underside of the lid), capillary action of the thermally conductive dielectric liquid, which may be promoted in certain ambient or operating conditions, may cause the thermally conductive dielectric liquid to travel up the DC bus toward the opening. The gasket operates to at least partially block the thermally conductive dielectric liquid from escaping through the opening. Further, in some embodiments, the flexible portion of the DC bus may be disposed at a non-90 degree angle (e.g., an oblique angle) relative to the underside of the lid, where the angle of the flexible portion of the DC bus may operate to reduce the above-described capillary action and, thus, reduce a likelihood that the thermally conductive dielectric liquid reaches the opening in the lid.

An example of a tank in which the presently disclosed power distribution assembly can be employed is found in U.S. application Ser. No. 17/491,041, which is hereby incorporated by reference in its entirety for all purposes. For example, the system(s) in U.S. application Ser. No. 17/491,041 include a tank interior configured to receive electronic components (e.g., servers), a control system configured to distribute a thermally conductive dielectric liquid from a bottom of the tank and upwardly through the tank interior, a wall disposed external to the tank, and an overflow gap positioned between the tank and the wall and configured to receive an overflow of the thermally conductive dielectric liquid, among other features. However, it should be understood that the disclosed power distribution assembly can be employed in a plethora of other tank configurations. Indeed, the presently disclosed power distribution assembly can be employed in many different types of liquid immersion cooling tanks, including those that do not employ the above-described overflow gap. These and other features are described in detail below with reference to the drawings.

Continuing now with the drawings, FIG. 1 is a schematic front view of an embodiment of a liquid immersion cooling system 10 having a tank 12 defining a tank interior 14 configured to receive electronic components 16 (e.g., servers), and having a power distribution assembly 18 with one or more power shelves 20 disposed outside of the tank interior 14. While only one power shelf 20 is illustrated in FIG. 1, any number of instances of power shelves can be employed in accordance with the present disclosure (e.g., for purposes of redundancy, increased capacity, variable voltage requirements across the electronic components 16, etc.). Embodiments employing multiple power shelves will be described with reference to later drawings. Further, it should be noted that certain features of the liquid immersion cooling system 10, such as relative positioning of various components, will be described below with reference to a coordinate system 22 illustrated in FIG. 1. The coordinate system 22 includes a vertical axis 24, a longitudinal axis 26, and a lateral axis 28, where the vertical axis 24 runs parallel with a Gravity vector 30. However, reference to components of the liquid immersion cooling system 10 (e.g., including relative positioning of various components) with respect to the coordinate system 22 should be understood as exemplary, and other features (e.g., differing positions and/or orientations of said components) are also possible.

The power distribution assembly 18 in FIG. 1 includes an AC power supply source 32 that provides an AC power supply 34, and an AC circuit breaker 36 that receives the AC power supply 34 as the AC power supply 34 is directed toward the power shelf 20. The AC circuit breaker 36 may operate to protect the system 10 against short circuits and power overload. That is, the AC circuit breaker 36 may be actuated in response to overload or short circuit to block the AC power supply 34 from reaching the power shelf 20. Additionally or alternatively, in some embodiments, the AC circuit breaker 36 may be manually actuatable to block the AC power supply 34 from reaching the power shelf 20. In some embodiments, a switch may be employed in lieu of, or in addition to, the AC circuit breaker 36.

The power shelf 20 in FIG. 1 includes a converter 35 configured to receive the AC power supply 34 and convert the AC power supply 34 to a direct current (DC) power supply 38. As previously described, the power shelf 20 and corresponding converter 35 are disposed in an external area 39 outside of the tank interior 14 defined by the tank 12. A DC bus 40 may guide the DC power supply 38 from the power shelf 20 (e.g., from the converter 35) and toward the tank 12. The DC bus 40 may extend through an opening 42 in a lid 44 coupled to, or forming a part of, the tank 12.

As previously described, the tank interior 14 defined by the tank 12 of the liquid immersion cooling system 10 may receive a thermally conductive dielectric liquid 45 such that the electronic components 16 (e.g., servers) are immersed or submerged in the thermally conductive dielectric liquid 45. A gasket 46 may be employed to seal the opening 42 about the DC bus 40, in an effort to block the thermally conductive dielectric liquid 45 from escaping the tank interior 14 through the opening 42. Indeed, while a liquid level 48 of the thermally conductive dielectric liquid 45 may be below an underside of the lid 44, capillary action may cause the thermally conductive dielectric liquid 45 to travel along the DC bus 40 and toward the opening 42. Accordingly, the gasket 46 may be employed at the opening 42 to block the thermally conductive dielectric liquid 45 from escaping through the opening 42.

In some embodiments, the gasket 46 may only partially seal the opening 42. Further, the capillary action of the thermally conductive dielectric liquid 45 may be increased during certain ambient and/or operating conditions. Accordingly, to further reduce a likelihood of the thermally conductive dielectric liquid 45 from escaping through the opening 42, the DC bus 40 may be oriented such that it forms an oblique angle 49 with the lid 44 (e.g., the underside of the lid 44). Put differently, the DC bus 40 may form the oblique angle 49 such that it does not run parallel to the vertical axis 24 (or the Gravity vector 30) immediately below the lid 44. The oblique angle 49 may operate to reduce the capillary action of the thermally conductive dielectric liquid 45, which reduces a likelihood that the thermally conductive dielectric liquid 45 escapes through the opening 42.

As shown in FIG. 1, the DC bus 40 may extend through the thermally conductive dielectric liquid 45 in the tank interior 14 and underneath the electronic components 16 (e.g., servers). That is, relative to the vertical axis 24, the electronic components 16 (e.g., disposed in a row extending along the longitudinal axis 26) may be disposed above a portion of the DC bus 40 extending underneath the electronic components 16. A number of blind mate connectors 50 may be employed to couple the portion of the DC bus 40 underneath the electronic components 16 with the DC inputs 52 (e.g., DC jacks) in each of the electronic components 16. While FIG. 1 illustrates the DC bus 40 extending from the power shelf 20 (e.g., the converter 35 of the power shelf 20) and to the blind mate connectors 50 coupled to the DC bus 40 and the DC jacks 52 of the electronic components 16, it should be understood, as described in detail with reference to later drawings, that the DC bus 40 may include a number of various portions (e.g., rigid portions, flexible portions, etc.) and components (e.g., one or more fuses).

In general, the power shelf 20 disposed external to the tank interior 14, as shown in the embodiment illustrated in FIG. 1, may improve an ease of manufacturing, assembling, repairing, and maintaining the liquid immersion cooling system 10. Indeed, AC-to-DC conversion may represent a prevalent fault mode in liquid immersion cooling, and in traditional embodiments, faults in AC-to-DC conversion occurring at the server may require that the server is taken off-line, removed from system, replaced, and repaired. Further, power cord management associated with traditional systems employing AC-to-DC conversion at the servers can be cumbersome and disorganized.

Figure 2:
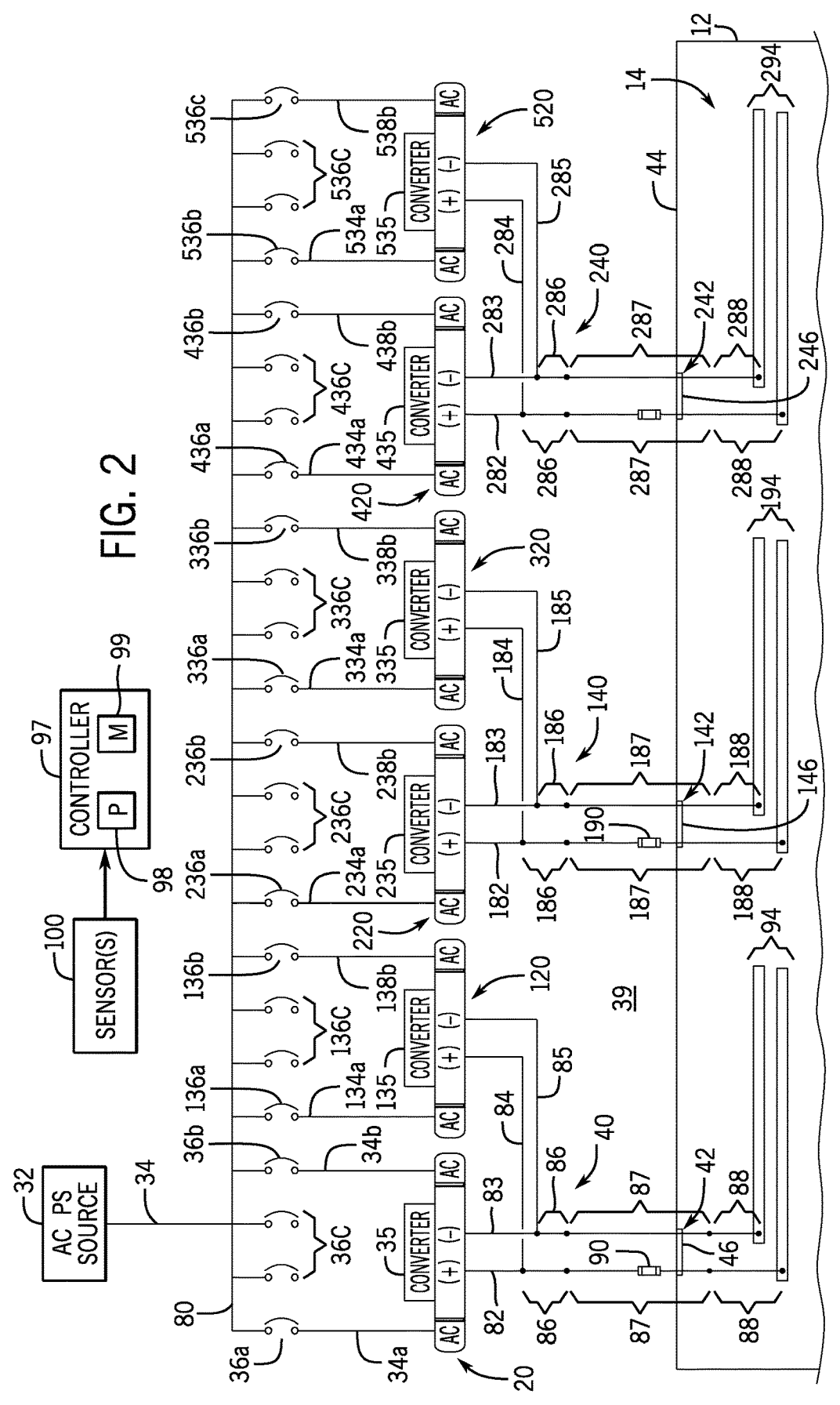

FIG. 2 is a sectioned plan view illustrating a portion of the liquid immersion cooling system 10 of FIG. 1, including a number of power shelves, each power shelf being configured to receive dual AC input power supply. For example, as previously described, the liquid immersion cooling system 10 includes the tank 12 defining the tank interior 14, and the lid 44 coupled to (or forming a part of) the tank 12. Further, the system 10 includes the AC power supply source 32.

In the illustrated embodiment, the AC power supply source 32 provides the AC power supply 34 toward a number of AC circuit breakers 36a, 36b, 36c, 136a, 136b, 136c, 236a, 236b, 236c, 336a, 336b, 336c, 436a, 436b, 436c, 536a, 536b, and 536c mounted on a DIN rail 80. For example, AC circuit breakers 36a and 36b correspond to the power shelf 20 (or power shelf module). Two spare AC circuit breakers 36c also correspond to the power shelf 20. The power shelf 20 is configured to receive dual AC input power supplies 34a, 34b. The dual AC input power supplies 34a, 34b may be provided for redundancy and/or variable power capacity control. In the illustrated embodiment, the system 10 includes six power shelves, including the first power shelf 20 (or first power shelf module), a second power shelf 120 (or second power shelf module), a third power shelf 220 (or third power shelf module), a fourth power shelf 320 (or fourth power shelf module), a fifth power shelf 420 (or fifth power shelf module), and a sixth power shelf 520 (or sixth power shelf module). In some embodiments, the first power shelf 20, the second power shelf 120, the third power shelf 220, the fourth power shelf 320, the fifth power shelf 420, and the sixth power shelf 520 may be integrated in a common housing referred to as a power shelf housing. Thus, in certain instances, the first, second, third, fourth, fifth, and sixth modules 20, 120, 220, 320, 420, 520 may be collectively a power shelf. Additionally or alternatively, the first, second, third, fourth, fifth, and sixth power shelves 20, 120, 220, 320, 420, 520 (or power shelf modules) may collectively be referred to as a power shelf assembly.

Like the first power shelf 20 configured to receive the dual AC input power supplies 34a, 34b, the second power shelf 120 may be configured to receive dual AC input power supplies 134a, 134b (e.g., from circuit breakers 136a, 136b), the third power shelf 220 may be configured to receive dual AC input power supplies 234a, 234b (e.g., from circuit breakers 236a, 236b), and so on and so forth. Further, each power shelf includes a dedicated converter. Indeed, the first power shelf 20 includes the first converter 35, the second power shelf 120 includes a second converter 135, the third power shelf 220 includes a third converter 235, the fourth power shelf 320 includes a fourth converter 335, the fifth power shelf 420 includes a fifth converter 435, and the sixth power shelf 520 includes a sixth converter 535.

The first power shelf 20 and the second power shelf 120 may share the DC bus 40, the third power shelf 220 and the fourth power shelf 320 may share a DC bus 140, and the fifth power shelf 420 and the sixth power shelf 520 may share a DC bus 240. As shown, each DC bus 40, 140, 240 may include multiple portions. For example, the DC bus 40 includes a positive line 82 (or positive bus bar) and a negative line 83 (or negative bus bar) corresponding to the first power shelf 20, and an additional positive line 84 (or additional positive bus bar) and additional negative line 85 (or additional negative bus bar) corresponding to the second power shelf 120. The positive line 82 and the negative line 83, for example, may be physically separate (e.g., separate bus bars) or contained within a single component of the DC bus 40. Further, the DC bus 140 includes a positive line 182 (or positive bus bar) and a negative line 183 (or negative bus bar) corresponding to the third power shelf 220, and an additional positive line 184 (or additional positive bus bar) and additional negative line 185 (or additional negative bus bar) corresponding to the fourth power shelf 320. Further, the DC bus 240 includes a positive line 282 (or positive bus bar) and a negative line 183 (or negative bus bar) corresponding to the fifth power shelf 420, and an additional positive line 284 (or additional positive bus bar) and additional negative line 285 (or additional negative bus bar) corresponding to the sixth power shelf 520. The positive line 82 corresponding to the first power shelf 20 and the additional positive line 84 corresponding to the second power shelf 120 may be joined (e.g., in a single positive bus bar), and the negative line 83 corresponding to the first power shelf 20 and the negative line 85 corresponding to the second power shelf 120 may be joined (e.g., in a single negative bus bar). Alternatively, the above-described lines may be separate and included in separate bus bar portions.

Further, each DC bus 40, 140, 240 includes various rigid and flexible portions. For example, the DC bus 40 includes a first rigid portion 86 and a flexible portion 87 (e.g., copper flexible portion) having a first end coupled to the rigid portion 86 and having a second end coupled to an additional (or second) rigid portion 88. As shown, the DC bus 40 includes a fuse 90 disposed in the flexible portion 87 and above the opening 42 in the lid 44 coupled to (or forming a part of) the tank 12. In this way, the flexible portion 87 extends through the opening 42, which is sealed by the gasket 46 as previously described. The flexible portion 87 transitions to the second rigid portion 88 as shown.

The DC bus 140 and the DC bus 240 may include the same or similar features as noted above with respect to the DC bus 40. Indeed, the DC bus 140 includes a first rigid portion 186, a flexible portion 187 coupled to the first rigid portion 186, and a second rigid portion 188 coupled to the flexible portion 187. The flexible portion 187 includes a fuse 190 and extends through an opening 142 in the lid 44, where the opening 142 is sealed by a gasket 146. Further, the DC bus 240 includes a first rigid portion 286, a flexible portion 287 coupled to the first rigid portion 286, and a second rigid portion 288 coupled to the flexible portion 187. The flexible portion 287 includes a fuse 290 and extends through an opening 242 in the lid 33, where the opening 242 is sealed by a gasket 246. The second rigid portion 88 of the DC bus 40 is coupled to, or includes, a rigid bar portion 94 (which may include a first bar, such as a positive bar, and a second bar, such as a negative bar) extending along a bottom of the tank 14, the second rigid portion 188 of the DC bus 140 is coupled to, or includes, a rigid bar portion 194 (which may include a first bar, such as a positive bar, and a second bar, such as a negative bar) extending along a bottom of the tank interior 14, and the DC bus 240 is coupled to, or includes, a rigid bar portion 294 (which may include a first bar, such as a positive bar, and a second bar, such as a negative bar) extending along a bottom of the tank interior 14. A voltage difference between the positive and negative lines (or bars) may correspond to a total voltage (or delta voltage) provided to the electronic components (e.g., computer servers). For example, a positive line may carry +24 VDC and a negative line may carry −24 VDC, such that the total voltage (or delta voltage) is 48 VDC. Of course, other voltages are also possible and may be dependent on power demand and desired power capacity, desired redundancy features, and/or desired compatibility with the electronic components. As previously described, blind mate connectors (not shown, but illustrated in FIG. 1) may be employed to couple the rigid bar portions 94, 194, 294 to various electronic components (not shown, but illustrate in FIG. 1), such as computer servers, disposed in the tank interior 14. As previously described, each electronic may couple to one, or two, or all three of 94, 194, 294, depending on desired power features relating to redundancy, capacity, and/or compatibility.

The illustrated arrangement in FIG. 2 can be employed in a number of ways. For example, the multiple power shelves 20, 120, 220, 320, 420, 520 and corresponding features may be employed to improve a power capacity (e.g., meet a power demand) corresponding with the liquid immersion cooling system 10, to provide redundancy in the case certain ones of the power shelves 20, 120, 220, 320, 420, 520 (or corresponding components) fail, and/or to provide DC power in various voltages (e.g., 12 VDC, 48-54 VDC, etc.) to various electronic components having different DC voltage power requirements. In other words, the converters 35, 135, 235, 335, 435, 535 may be configured to output DC power supplies having the same voltage, or certain ones of the converters 35, 135, 235, 335, 435, 535 may be configured to output DC power supplies having differing voltages. Accordingly, it should be understood that the rigid bar portions 94, 194, 294 of the DC busses 40, 140, 240, respectively, may be configured to couple (e.g., via blind mate connectors) to the same electronic components or to different groupings of the electronic components, as understood by one of ordinary skill in the art.

In some embodiments, a controller 97 is employed and includes a processor 98 and a memory 99. The processor 98 is configured to execute instructions stored on the memory 99 to perform various control actions corresponding to the above-described components and functionality of the liquid immersion cooling system 10. In some embodiments, the controller 97 is configured to perform various control actions based on data feedback received from a sensor or sensor assembly 100, such as a power sensor or power sensor assembly. For example, the controller 97 may operate to connect and/or disconnect various ones of the DC busses 40, 140, 240 from various ones or groupings of the electronic components (e.g., shown in FIG. 1 and denoted with reference numeral 16) based on lost or available power, based on power compatibility, etc.

It should be noted that the features described above with respect to FIG. 2 are merely provided as examples of various ways a power distribution assembly in accordance with the present disclosure can be employed in the liquid immersion cooling system 10. Other configurations are also possible. For example, in an embodiment, the DC bus 40 in FIG. 2 may be configured to provide a DC power supply to a first tank, the DC bus 140 in FIG. 2 may be configured to provide a DC power supply to a second tank, and the DC bus 240 in FIG. 2 may be configured to provide a DC power supply to a third tank. In general, the disclosed embodiments include improvements over traditional systems and methods at least because AC-to-DC power conversion is implemented in the external area 39 (i.e., outside the tank interior 14 of the tank 12) instead of within the electronic components (e.g., computer servers), which reduces AC cord management and improves ease of manufacturing, assembly, maintenance, and repair of the system 10, as previously described.

Figure 3:
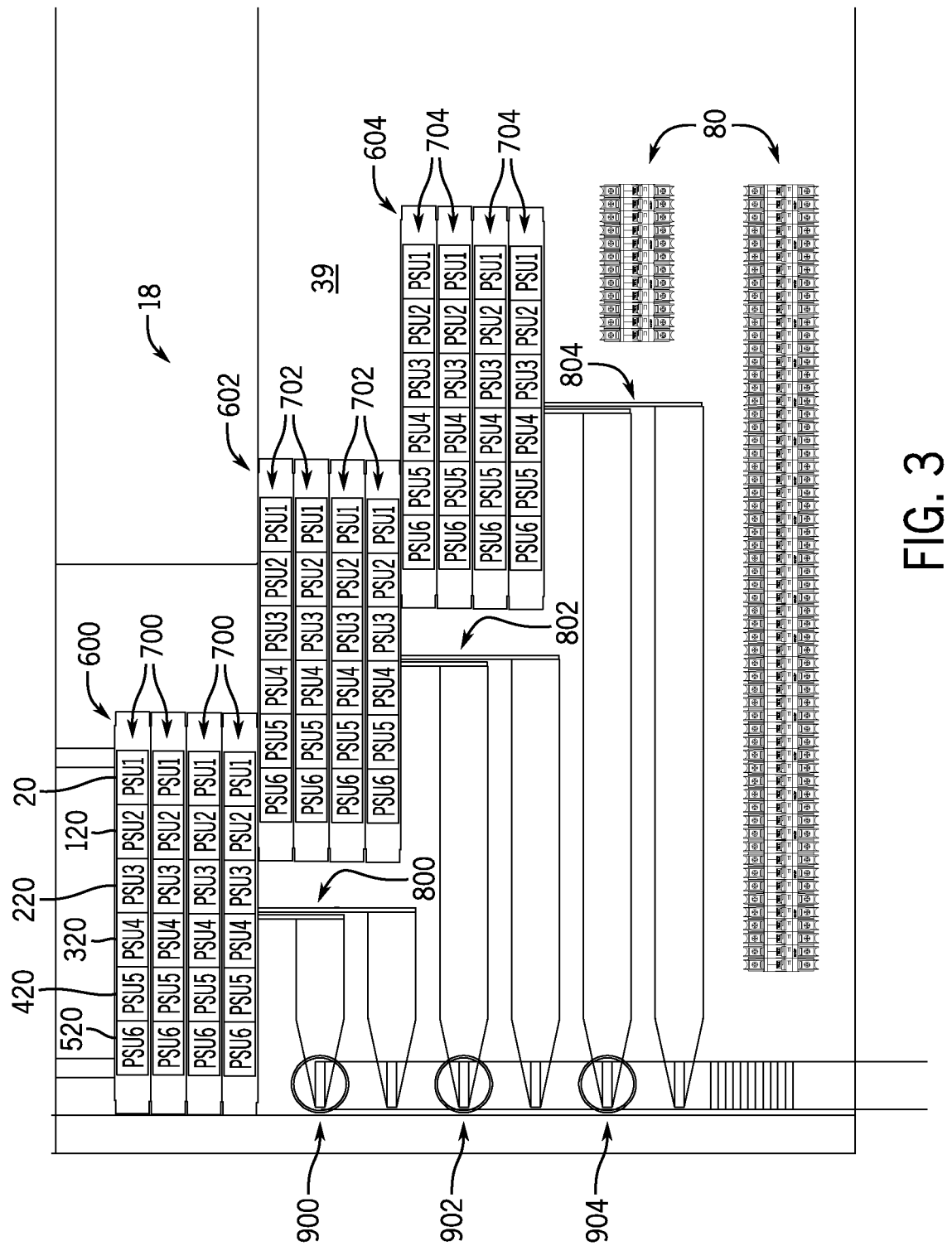
FIG. 3 is a schematic illustration of the a power distribution assembly employing multiple power shelf assemblies, each including six power shelves (or power shelf modules), for the liquid immersion cooling system of FIG. 1, in accordance with an aspect of the present disclosure.

FIG. 3 is a schematic illustration of an embodiment of the power distribution assembly 18 employing multiple power shelf assemblies, each including six power shelves (or power shelf modules), for the liquid immersion cooling system 10 of FIG. 1. In the illustrated embodiment, the power distribution assembly 18 includes a first power rack 600 including a number of power shelf assemblies 700, a second power rack 602 including a number of power shelf assemblies 702, and a third power rack 604 including a number of power shelf assemblies 704. Each power shelf assembly 700 of the first power rack 600 may include the first power shelf module 20, the second power shelf module 120, the third power shelf module 220, the fourth power shelf module 320, the fifth power shelf module 420, and the sixth power shelf module 520. Likewise, each power shelf assembly 702 of the second power rack 602 and each power shelf assembly 704 of the third power rack 604 may include the power shelf modules 20, 120, 220, 320, 420, 520. A first DC bus assembly 800 may be provided for the first power rack 600, a second DC bus assembly 802 may be provided for the second power rack 602, and a third DC bus assembly 804 may be provided for the third power rack 804. As previously described, each of the first, second, and third DC bus assemblies 800, 802, 804 may include the first rigid portion(s) discussed with respect to FIG. 2, the flexible portion(s) discussed with respect to FIG. 2, and the second rigid portion(s) discussed with respect to FIG. 2. Further, fuses 900, 902, 904 may be employed in the flexible portion(s) of the DC bus assemblies 800, 802, 804, respectively. The DIN rail(s) 80, including AC circuit breakers, is also shown in FIG. 3.

Figure 4:
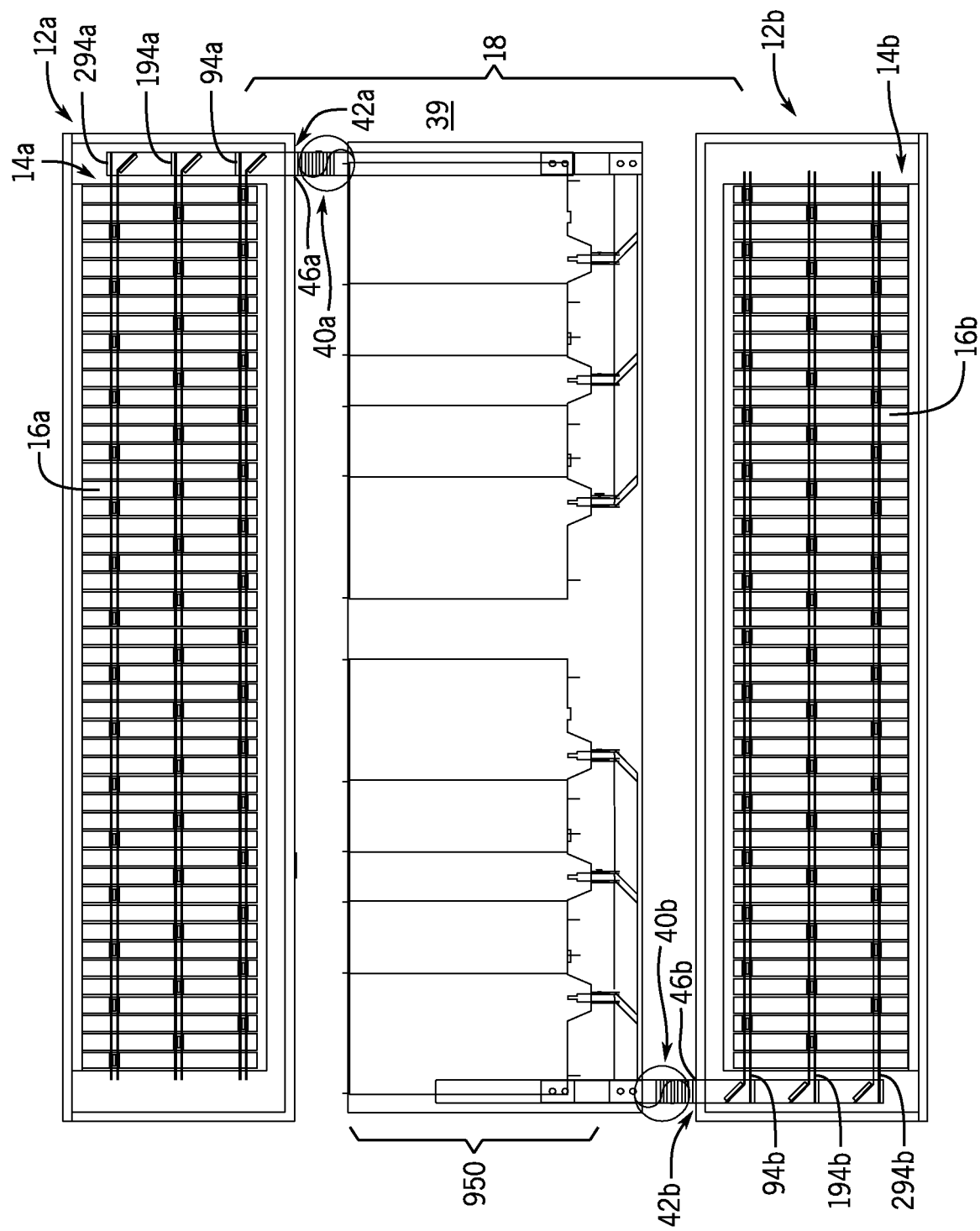
FIG. 4 is a schematic plan view of one possible layout of a power distribution assembly employed in the liquid immersion cooling system of FIG. 1, in accordance with an aspect of the present disclosure.

FIG. 4 is a schematic plan view of one possible layout of an embodiment of the power distribution assembly 18 employed in the liquid immersion cooling system 10 of FIG. 1. In the illustrated embodiment, the power distribution assembly 18 provides DC power supply to first electronic components 16a disposed in a first tank interior 14a of a first tank 12a, and to second electronic components 16b disposed in a second tank interior 14b of a second tank 12b. A first DC bus assembly 40a of the power distribution assembly 18 extends through an opening 42a in a first lid 44a of the first tank 12a, and a second DC bus assembly 40b of the power distribution assembly 18 extends through an opening 42b in a second lid 44b of the second tank 12b. The first DC bus assembly 40a may include three DC bus bar portions 94a, 194a, 294a extending in the tank interior 14a of the first tank 12a, and the second DC bus assembly 40b may include three DC bus bar portions 94b, 194b, 294b extending into the tank interior 14b of the second tank 12b. As previously described, an external portion 950 of the power distribution assembly 18, in the external area 39 outside of the tank interiors 14a, 14b, may receive AC power and convert the AC power to DC power. The DC power is then routed to the electronic components 16a, 16b in the tank interiors 14a, 14b, as previously described.

Figure 5:
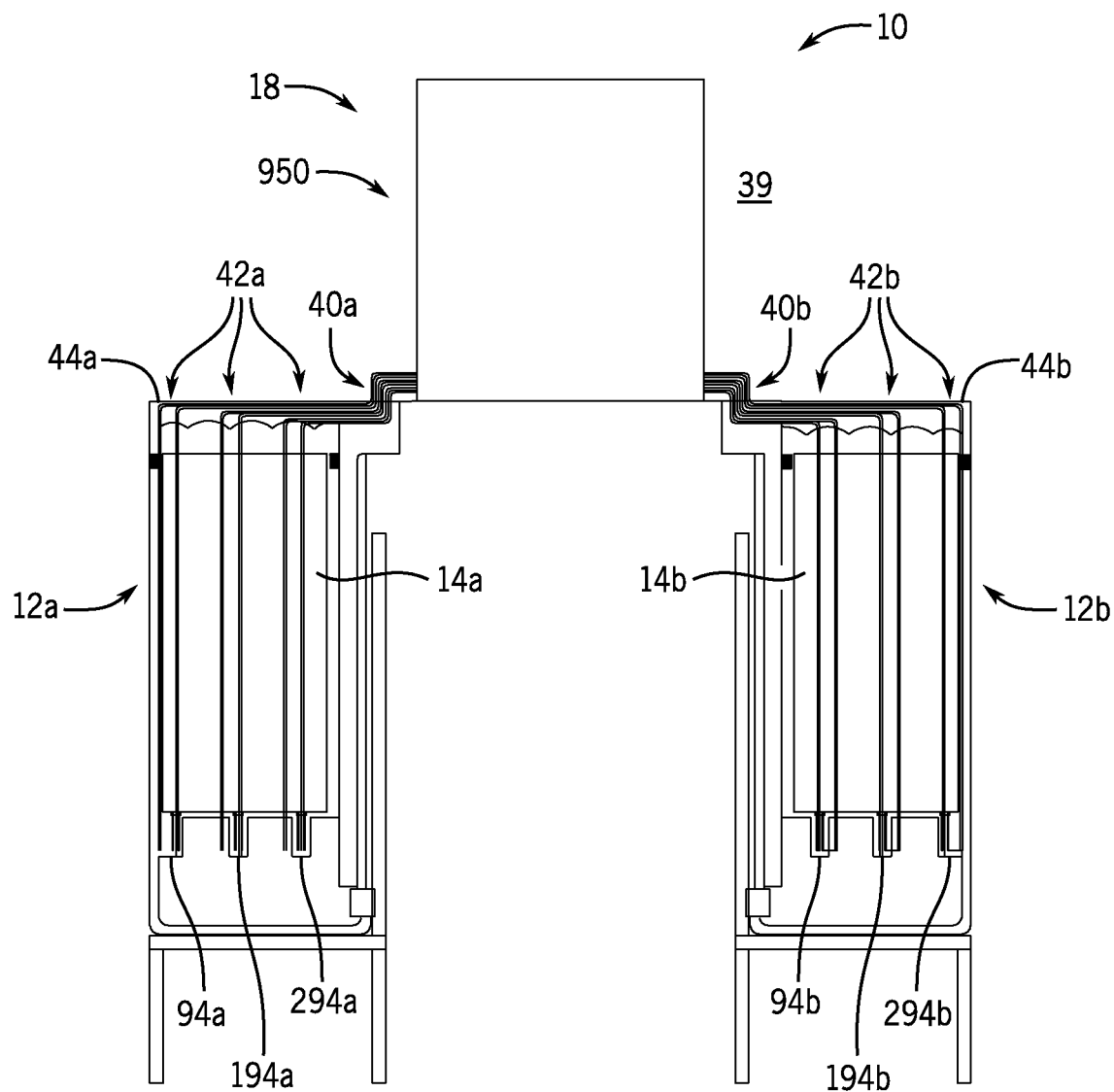
FIG. 5 is a schematic elevation view of a possible layout of a power distribution assembly employed in the liquid immersion cooling system of FIG. 1, in accordance with an aspect of the present disclosure.

FIG. 5 is a schematic elevation view of a possible layout of the power distribution assembly 18 employed in the liquid immersion cooling system 10 of FIG. 1. The layout in FIG. 5 may be the same as, or similar to, the layout in FIG. 4. As is the case in FIG. 4, FIG. 5 includes the first tank 12a defining the first tank interior 14a and the second tank 12b defining the second tank interior 14b. Further, the power distribution assembly 18 includes the external portion 950 disposed in the external environment 39 outside of the tank interiors 14a, 14b, where the AC-to-DC power conversion occurs in the external portion 950. The DC bus assemblies 40a, 40b route the DC power supply through one or more openings 42a, 42b in the lids 44a, 44b of the tanks 12a, 12b. As previously described, the three DC bus bar portions 94a, 194a, 294a may be employed in the first tank 12a and the three DC bus bar 94b, 194b, 294b may be employed in the second tank 12b. Any of the features illustrated in FIGS. 1-3 can be employed in the embodiments illustrated in FIGS. 4 and 5. In general, in each of the system illustrated in FIGS. 1-5, AC-to-DC power conversion is completed outside of the various tank interiors (e.g., in the external environment 39), and the DC power supply is routed into the various tank interiors and provided to the electronic components (e.g., computer servers) therein.

Figure 6:
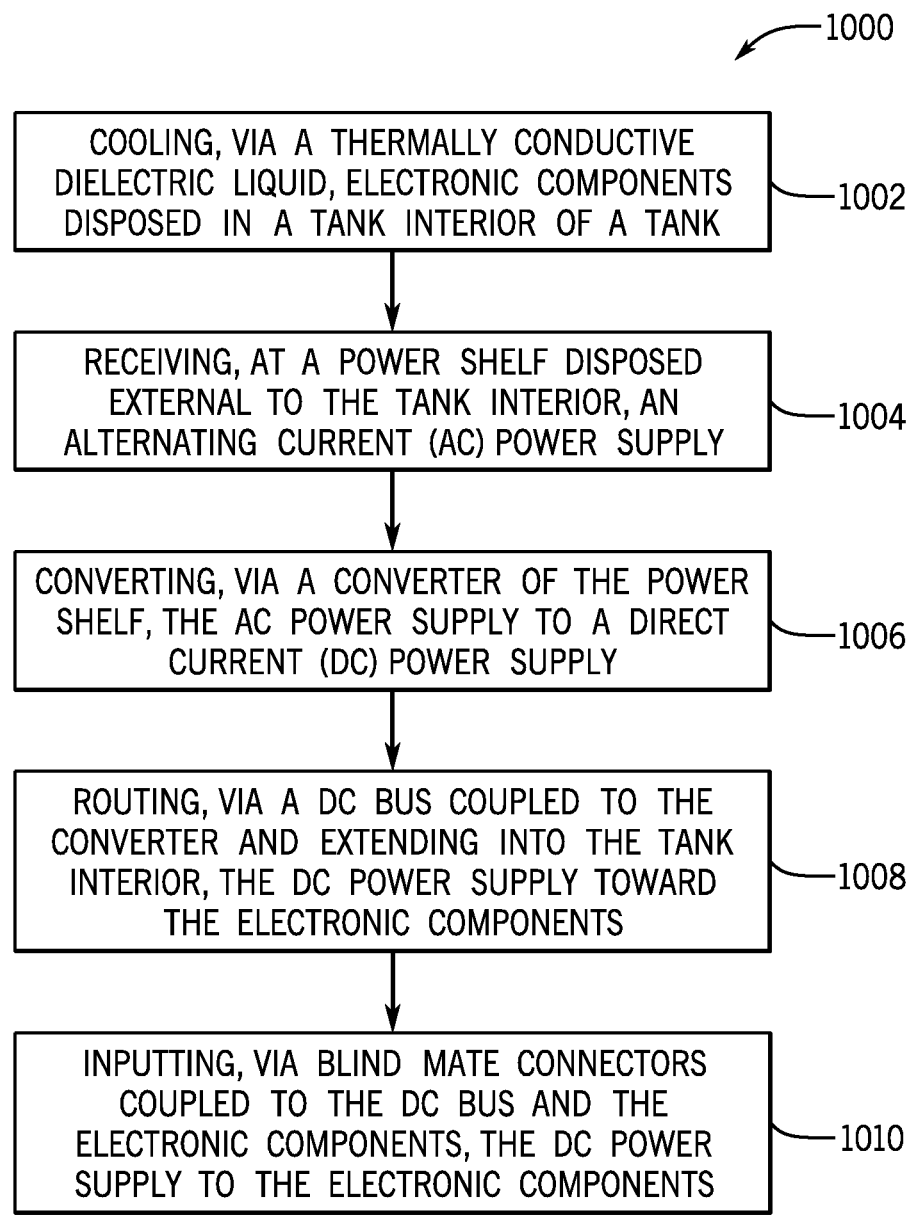
FIG. 6 is a process flow diagram illustrating a method of operating a liquid immersion cooling system including a power distribution assembly, in accordance with an aspect of the present disclosure.

FIG. 6 is a process flow diagram illustrating a method 1000 of operating a liquid immersion cooling system including a power distribution assembly. In the illustrated embodiment, the method 1000 includes cooling (block 1002), via a thermally conductive dielectric liquid, electronic components disposed in a tank interior of a tank of the liquid immersion cooling system.

Further, the method 1000 includes receiving (block 1004), at a power shelf disposed external to the tank interior, an alternating current (AC) power supply. As previously described, an AC circuit breaker may be disposed upstream of the power shelf and configured to block the AC power supply from reaching the power shelf in the event of a short circuit or overload. Further, as previously described, dual AC power supplies from the AC power source may be provided to the power shelf in certain embodiments.

Further, the method 1000 includes converting (block 1006), via a converter of the power shelf, the AC power supply to a direct current (DC) power supply. The DC power supply may be, for example, 12 VDC, 48-54 VDC, or any other VDC suitable for, and compatible with, the electronic components ultimately receiving the DC power supply. The method 1000 includes routing (block 1008), via a DC bus coupled to the converter and extending into the tank interior, the DC power supply toward the electronic components. The DC bus may include, for example, a first rigid portion extending from the power shelf, a flexible portion coupled to the first rigid portion, including a fuse therein, and extending through a lid of the tank, and a second rigid portion coupled to the flexible portion (e.g., within the tank interior). The rigid portion may extend underneath the electronic components and/or along a bottom of the tank interior.

The method 1000 also includes inputting (block 1010), via blind mate connectors coupled to the DC bus and to the electronic components, the DC power supply to the electronic components. For example, each electronic component may include a DC jack coupled to a corresponding one of the blind mate connectors.

Other steps in the method 1000 are also possible. For example, as previously described, multiple power shelves and multiple DC busses may be employed. Indeed, in some embodiments, a first DC bus and a second DC bus may be employed for purposes of redundancy in the event one power shelf (or corresponding components) fails. Additionally or alternatively, one DC bus may provide a DC power supply to a first group of electronic components at a first VDC (e.g., 12 VDC), while another DC bus may provide a DC power supply to a second group of electronic components at a second VDC (e.g., 48-54 VDC). The method 1000 illustrated in FIG. 6 is provided merely as an example, and other method steps and/or functionality described with respect to the componentry illustrated in FIGS. 1-5 are also possible.

Technical benefits associated with the presently disclosed immersion cooling systems and methods include improved temperature control of electronic components (e.g., computer servers) via heat exchange with a thermally conductive dielectric liquid, improved flow control of the thermally conductive dielectric liquid, reduced power consumption of the system, reduced complexity and cost of the system, and the like relative to conventional embodiments.

The present disclosure is not to be limited in scope by the specific embodiments described herein. Indeed, various modifications of the disclosure in addition to those described herein will become apparent to those skilled in the art from the foregoing description. Such modifications are intended to fall within the scope of the appended claims.

While only certain features and embodiments of the disclosure have been illustrated and described, many modifications and changes may occur to those skilled in the art, such as variations in sizes, dimensions, structures, shapes and proportions of the various elements, values of parameters including temperatures and pressures, mounting arrangements, use of materials, colors, orientations, etc., without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the disclosure. Furthermore, in an effort to provide a concise description of the exemplary embodiments, all features of an actual implementation may not have been described, such as those unrelated to the presently contemplated best mode of carrying out the disclosure, or those unrelated to enabling the claimed disclosure. It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

All patents, applications, publications, test methods, literature, and other materials cited herein are hereby incorporated by reference.

We claim:

1. A liquid immersion cooling system, comprising:
   a tank defining a tank interior configured to receive a plurality of electronic components and a thermally conductive dielectric liquid to cool the plurality of electronic components;
   a power shelf external to the tank interior, wherein the power shelf comprises a converter configured to receive an alternating current (AC) power supply and convert the AC power supply to a direct current (DC) power supply;
   a DC bus configured to route the DC power supply from the power shelf, into the tank interior, and to the plurality of electronic components;
   an additional power shelf external to the tank interior, wherein the additional power shelf comprises an additional converter configured to receive the AC power supply and covert the AC power supply to an additional DC power supply; and
   an additional DC bus configured to route the additional DC power supply from the power shelf, into the tank interior, and to the plurality of electronic components or an additional plurality of electronic components.

2. The liquid immersion cooling system of claim 1, wherein:
the converter is configured to convert the AC power supply to the DC power supply such that the DC power supply includes a first voltage; and
the additional converter is configured to convert the AC power supply to the additional DC power supply such that the additional DC power supply includes a second voltage different than the first voltage.

3. The liquid immersion cooling system of claim 1, wherein:
the converter is configured to convert the AC power supply to the DC power supply such that the DC power supply includes a first voltage; and
the additional converter is configured to convert the AC power supply to the additional DC power supply such that the additional DC power supply includes a second voltage substantially equal to the first voltage.

4. The liquid immersion cooling system of claim 1, wherein the DC bus comprises:
a first rigid portion coupled to the power shelf;
a flexible portion having a first end coupled to the first rigid portion, a mid-section having a fuse therein, and a second end opposing the first end; and
a second rigid portion coupled to the second end of the flexible portion and disposed in the tank interior.

5. The liquid immersion cooling system of claim 4, comprising a lid extending over the tank interior and coupled to the tank, wherein the flexible portion of the DC bus extends through an opening in the lid, and the fuse is disposed external to the tank interior.

6. The liquid immersion cooling system of claim 4, comprising a plurality of blind mate connectors configured to:
interface the second rigid portion of the DC bus with the plurality of electronic components; and
distribute the DC power supply from the second rigid portion of the DC bus to the plurality of electronic components.

7. The liquid immersion cooling system of claim 1, comprising:
a lid extending over the tank interior and coupled to the tank;
an opening in the lid, wherein the DC bus extends through the opening; and
a gasket that seals the opening around the DC bus.

8. The liquid immersion cooling system of claim 1, comprising an AC power circuit breaker coupled to an AC power supply source configured to provide the AC power supply to the converter of the power shelf.

9. The liquid immersion cooling system of claim 1, wherein each electronic component of the plurality of electronic components comprises a DC power jack configured to receive the DC power supply from the DC bus.

10. A liquid immersion cooling system, comprising:
a tank defining a tank interior configured to receive a thermally conductive dielectric liquid;
a plurality of electronic components disposed in the tank interior;
a power shelf external to the tank interior, wherein the power shelf comprises a converter configured to receive an alternating current (AC) power supply and convert the AC power supply to a direct current (DC) power supply;

a DC bus coupled to the converter and extending into the tank interior;
a plurality of connectors coupling the DC bus and the plurality of electronic components; and
a lid engaged with the tank, wherein:
the plurality of electronic components comprises a plurality of upper ends facing the lid and a plurality of lower ends opposing the plurality of upper ends;
the DC bus extends through an opening in the lid and toward the plurality of lower ends of the plurality of electronic components; and
the plurality of connectors comprises a plurality of blind mate connectors coupling the DC bus and the plurality of lower ends of the plurality of electronic components.

11. The liquid immersion cooling system of claim 10, comprising a gasket configured to interface with the opening, wherein:
the DC bus extends through the opening in the lid; and
the gasket seals the opening in the lid around the DC bus.

12. The liquid immersion cooling system of claim 11, wherein the DC bus comprises:
a first rigid portion coupled to the converter and disposed outside of the tank interior;
a flexible portion having a first end coupled to the first rigid portion, a mid-section having a fuse therein, and a second end opposing the first end, wherein the flexible portion extends through the opening in the lid and the gasket seals the opening in the lid around the flexible portion; and
a second rigid portion coupled to the second end of the flexible portion and disposed in the tank interior.

13. The liquid immersion cooling system of claim 10, comprising:
an additional power shelf external to the tank interior, wherein the additional power shelf comprises an additional converter configured to receive the AC power supply and covert the AC power supply to an additional DC power supply;
an additional DC bus coupled to the additional converter and extending into the tank interior; and
an additional plurality of connectors coupling the additional DC bus and the plurality of electronic components or an additional plurality of electronic components.

14. A method of operating a liquid immersion cooling system, the method comprising:
cooling, via a thermally conductive dielectric liquid, a plurality of electronic components disposed in a tank interior of a tank;
receiving, at a power shelf disposed external to the tank interior, an alternating current (AC) power supply;
converting, via a converter of the power shelf, the AC power supply to a direct current (DC) power supply;
routing, via a DC bus coupled to the converter and extending into the tank interior, the DC power supply toward the plurality of electronic components;
cooling, via the thermally conductive dielectric liquid, an additional plurality of electronic components disposed in the tank interior of the tank;
receiving, at an additional power shelf disposed external to the tank interior, the AC power supply;
converting, via an additional converter of the additional power shelf, the AC power supply to an additional DC power supply; and routing, via an additional DC bus coupled to the converter and extending into the tank interior, the additional DC power supply toward the additional plurality of electronic components.

15. The method of claim 14, comprising inputting, via blind mate connectors coupled to the DC bus and to the plurality of electronic components, the DC power supply to the plurality of electronic components.

16. The method of claim 14, comprising:
converting, via the converter of the power shelf, the AC power supply to the direct current (DC) power supply such that the DC power supply includes a first voltage; and
converting, via the additional converter of the additional power shelf, the AC power supply to the additional DC power supply such that the additional DC power supply includes a second voltage different than the first voltage.

17. The method of claim 14, comprising sealing an opening in a lid of the tank via a gasket such that the DC bus extends through the opening and the opening is sealed by the gasket about the DC bus.

18. A liquid immersion cooling system, comprising:
a tank defining a tank interior configured to receive a plurality of electronic components and a thermally conductive dielectric liquid to cool the plurality of electronic components;
a power shelf external to the tank interior, wherein the power shelf comprises a converter configured to receive an alternating current (AC) power supply and convert the AC power supply to a direct current (DC) power supply; and
a DC bus configured to route the DC power supply from the power shelf, into the tank interior, and to the plurality of electronic components, wherein the DC bus comprises:
a first rigid portion coupled to the power shelf;
a flexible portion having a first end coupled to the first rigid portion, a mid-section having a fuse therein, and a second end opposing the first end; and
a second rigid portion coupled to the second end of the flexible portion and disposed in the tank interior.

19. The liquid immersion cooling system of claim 18, comprising a lid extending over the tank interior and coupled to the tank, wherein the flexible portion of the DC bus extends through an opening in the lid, and the fuse is disposed external to the tank interior.

20. The liquid immersion cooling system of claim 18, comprising a plurality of blind mate connectors configured to:
interface the second rigid portion of the DC bus with the plurality of electronic components; and
distribute the DC power supply from the second rigid portion of the DC bus to the plurality of electronic components.

21. A liquid immersion cooling system, comprising:
a tank defining a tank interior configured to receive a plurality of electronic components and a thermally conductive dielectric liquid to cool the plurality of electronic components;
a power shelf external to the tank interior, wherein the power shelf comprises a converter configured to receive an alternating current (AC) power supply and convert the AC power supply to a direct current (DC) power supply;
a DC bus configured to route the DC power supply from the power shelf, into the tank interior, and to the plurality of electronic components;
a lid extending over the tank interior and coupled to the tank;
an opening in the lid, wherein the DC bus extends through the opening; and
a gasket that seals the opening around the DC bus.

22. A liquid immersion cooling system, comprising:
a tank defining a tank interior configured to receive a thermally conductive dielectric liquid;
a plurality of electronic components disposed in the tank interior;
a power shelf external to the tank interior, wherein the power shelf comprises a converter configured to receive an alternating current (AC) power supply and convert the AC power supply to a direct current (DC) power supply;
a DC bus coupled to the converter and extending into the tank interior;
a plurality of connectors coupling the DC bus and the plurality of electronic components; and
a lid engaged with the tank, an opening in the lid, and a gasket configured to interface with the opening, wherein:
the DC bus extends through the opening in the lid; and
the gasket seals the opening in the lid around the DC bus.

23. The liquid immersion cooling system of claim 22, wherein the DC bus comprises:
a first rigid portion coupled to the converter and disposed outside of the tank interior;
a flexible portion having a first end coupled to the first rigid portion, a mid-section having a fuse therein, and a second end opposing the first end, wherein the flexible portion extends through the opening in the lid and the gasket seals the opening in the lid around the flexible portion; and
a second rigid portion coupled to the second end of the flexible portion and disposed in the tank interior.

24. A liquid immersion cooling system, comprising:
a tank defining a tank interior configured to receive a thermally conductive dielectric liquid;
a plurality of electronic components disposed in the tank interior;
a power shelf external to the tank interior, wherein the power shelf comprises a converter configured to receive an alternating current (AC) power supply and convert the AC power supply to a direct current (DC) power supply;
a DC bus coupled to the converter and extending into the tank interior;
a plurality of connectors coupling the DC bus and the plurality of electronic components;
an additional power shelf external to the tank interior, wherein the additional power shelf comprises an additional converter configured to receive the AC power supply and covert the AC power supply to an additional DC power supply;
an additional DC bus coupled to the additional converter and extending into the tank interior; and
an additional plurality of connectors coupling the additional DC bus and the plurality of electronic components or an additional plurality of electronic components.

25. A method of operating a liquid immersion cooling system, the method comprising:

cooling, via a thermally conductive dielectric liquid, a plurality of electronic components disposed in a tank interior of a tank;

receiving, at a power shelf disposed external to the tank interior, an alternating current (AC) power supply;

converting, via a converter of the power shelf, the AC power supply to a direct current (DC) power supply;

routing, via a DC bus coupled to the converter and extending into the tank interior, the DC power supply toward the plurality of electronic components; and sealing an opening in a lid of the tank via a gasket such that the DC bus extends through the opening and the opening is sealed by the gasket about the DC bus.

\* \* \* \* \*